(12) United States Patent
Bonen

(10) Patent No.: US 10,560,305 B1
(45) Date of Patent: Feb. 11, 2020

(54) DIGITAL COMPENSATION FOR RF IMPERFECTIONS OF A SYSTEM COMPOSED OF MULTIPLE MODULES

(71) Applicant: Harmonic, Inc., San Jose, CA (US)

(72) Inventor: Adi Bonen, Belle Mead, NJ (US)

(73) Assignee: Harmonic, Inc., San Jose, CA (US)

( * ) Notice: Subject to any disclaimer, the term of this patent is extended or adjusted under 35 U.S.C. 154(b) by 0 days.

(21) Appl. No.: 16/155,715

(22) Filed: Oct. 9, 2018

Related U.S. Application Data

(60) Provisional application No. 62/570,613, filed on Oct. 10, 2017.

(51) Int. Cl.
| | | |
|---|---|---|
| *H04L 27/36* | (2006.01) | |
| *H04L 27/38* | (2006.01) | |
| *H03F 1/32* | (2006.01) | |
| *H03F 1/02* | (2006.01) | |

(52) U.S. Cl.
CPC ....... *H04L 27/3854* (2013.01); *H03F 1/0294* (2013.01); *H03F 1/3247* (2013.01); *H04L 27/36* (2013.01)

(58) Field of Classification Search
CPC ........ H03F 1/32; H03F 1/0294; H03F 1/3247; H03F 3/19; H03F 3/24; H03M 1/66; H03M 3/19; H04B 1/04; H04B 1/62; H04B 7/04; H04B 17/21; H04L 25/03; H04L 25/49; H04L 27/36; H04L 27/3854
USPC .......... 330/10, 129, 136; 375/224, 232, 296; 455/63.1, 73, 91, 103, 114.3, 126
See application file for complete search history.

(56) References Cited

U.S. PATENT DOCUMENTS

| | | | |
|---|---|---|---|
| 2004/0179629 A1* | 9/2004 | Song ..................... | H03F 1/3247 375/296 |
| 2017/0104502 A1* | 4/2017 | Pratt ........................ | H03F 3/19 |

* cited by examiner

*Primary Examiner* — Shawkat M Ali
(74) *Attorney, Agent, or Firm* — Brokaw Patent Law PC; Christopher J. Brokaw

(57) ABSTRACT

Approaches for compensating for RF imperfections in a system that comprises two or more independent modules. The two or more independent modules may be comprised within a remote PHY node (RPN). RF calibration data is stored in one or more non-volatile mediums for two or more independent modules. Each of the two or more independent modules are electronically coupled in a sequence via a transmission medium. A first independent module digital compensates a RF signal for a set of two or more modules that are coupled together in sequence via the transmission medium. The first independent module may correspond to a remote PHY device (RPD).

20 Claims, 4 Drawing Sheets

DIGITAL COMPENSATION FOR RF IMPERFECTIONS OF A SYSTEM COMPOSED OF MULTIPLE MODULES

CLAIM OF PRIORITY

The present application claims priority to U.S. Provisional Patent Application No. 62/570,613, entitled "Digital Compensation for RF Imperfections of a System Composed of Multiple Independent Modules," filed Oct. 10, 2017, the disclosure of which is hereby incorporated by reference for all purposes in its entirety as if fully set forth herein.

The present application is related to U.S. Non-Provisional patent application Ser. No. 16/155,687, entitled "RPD MAC Address Stored in Node," filed Oct. 9, 2018, the disclosure of which is hereby incorporated by reference for all purposes in its entirety as if fully set forth herein.

FIELD OF THE INVENTION

Embodiments of the invention generally relate to the digital compensation of RF Imperfections, and more particular relate to the digital compensation of RF imperfections of a system that is composed of multiple independent modules.

BACKGROUND

RF components, such as amplifiers, filters, switches, splitters, and couplers, have a frequency dependent transfer function. Even when the desire is to achieve a flat transfer function (no gain or phase variations over frequency), RF components often introduce variations that detract from their performance of their circuits. As a result, the RF circuits of RF components often exhibit gain or phase variations over frequency, which results in a non-flat RF output signal, despite of the desire to emit a "flat" response across frequency. In some cases, it is desirable to emit a certain profile of RF power vs. frequency, and the RF circuit and/or RF components imperfections cause some variations relative to the desired profile.

The transfer function of RF components (especially active devices such as amplifiers) is also affected by temperature. Both the nominal gain and the gain function over frequency are typically affected by temperature. Thus, the output of an RF device typically departs from the desired gain vs. frequency profile to a greater degree than normal when the temperature varies, and especially when the temperature reaches the FR device's intended temperature operation extremes.

Often, the imperfections introduced by the RF component and its RF circuitry, left unaddressed, result in a product performance that is insufficient to achieve its intended purpose. Some mechanism to reduce the impact of the various variations and imperfections is necessary to make that product viable.

Accordingly, various RF products often incorporate additional compensation elements to minimize the departure from the desired output profile. These compensation elements are often constructed by some additional RF components designed to cause an effect opposite to the undesired effects caused by the RF circuit and its components. Compensation of the gain variation over frequency is typically performed using RF equalizers consisting of resistors, capacitors and inductors. Compensation of gain variation over temperature is typically performed using a resistive attenuator, which incorporates an element with temperature varying resistance (i.e., thermistor) to change the attenuation as a function of temperature. Compensation of gain frequency-tilt variation over temperature is typically performed using an RF equalizer, while a thermistor is used to change the attenuation at a certain high frequencies while other components (such as capacitors, inductors, and/or resistors.) are used to lessen the attenuation at lower frequencies in a predetermined manner. Various other compensation circuit types exist to compensate for various other undesired RF effects introduced by imperfections in the RF components and its RF circuits that implement the main product desired functionality.

Unfortunately, all types of RF compensation circuits typically exhibit a certain insertion loss (negative gain). That insertion loss may be minimized in some conditions, such as extreme temperatures and at certain frequencies; however, the insertion loss will be even higher in other conditions (such as other frequencies, other temperatures, etc.). As the amount of compensation that is required increased, so does the loss exhibited by the compensation circuit. This loss typically is dealt with by adding more gain to the product (such as by an additional amplifier), which often results in higher power consumption and higher product cost, even on top of the compensation circuit cost itself.

The compensation circuits themselves need to be carefully designed and optimized. In some cases, a generic optimization of the compensation circuit is insufficient, and the compensation circuit must be individually tuned during the production of every unit. Such a process is quite time consuming, and thus increases the production cost substantially. Even so, compensation circuits typically enable limited success, and residual imperfections still impair the performance of the RF product.

In some prior art products, a radio frequency (RF) signal is digitally generated, then converted to analog by an analog-to-digital-converter (ADC), and then further processed by RF circuitry. In such cases, the imperfection introduced by the RF components and its circuit may be compensated for by digital compensation functions. FIG. 1 is a block diagram of such digital compensation functions according to the prior art. Such a solution is often preferred in performance, cost, and power efficiency when compared to RF compensation circuits. Moreover, automated calibration techniques can be introduced during the manufacturing of a product to individually optimize some parameters of the digital compensation functions for every manufactured unit.

A typical implementation of such a calibration scheme will employ a measurement device which measures and quantifies the RF signal imperfections at the product output. These measurements are processed by the calibration system to produce compensation parameters for the digital compensation functions implemented in the product. The compensation parameters are stored in a non-volatile memory incorporated in the product. Thereafter, the product uses the non-volatile stored parameters to digitally compensate for the RF circuit imperfections and produce less imperfect, more ideal output signal.

BRIEF DESCRIPTION OF THE DRAWINGS

Embodiments of the invention are illustrated by way of example, and not by way of limitation, in the figures of the accompanying drawings and in which like reference numerals refer to similar elements and in which.

DETAILED DESCRIPTION OF THE INVENTION

Approaches for compensating for RF imperfections in a system comprising two or more independent modules are presented herein. In the following description, numerous specific details are set forth in order to provide a thorough understanding of the embodiments of the invention described herein. It will be apparent, however, that the embodiments of the invention described herein may be practiced without these specific details. In other instances, well-known structures and devices are shown in block diagram form or discussed at a high level in order to avoid unnecessarily obscuring teachings of embodiments of the invention.

The automatically calibrated digital compensation schemes of the prior art are limited to the calibration of a single integrated product. However, it is desirable to be able to compensate for the imperfections and variability that exists in compound and modular products consisting of multiple RF modules, each of which may be manufactured separately. Moreover, the modular nature of such systems allows for independent replacement (e.g., upon hardware failure) of one of the modules by an identical functionality module. However, the replacement module is likely to exhibit different gain or phase variations over frequency as well as different temperature related gain and tilt variations.

Figure 1:
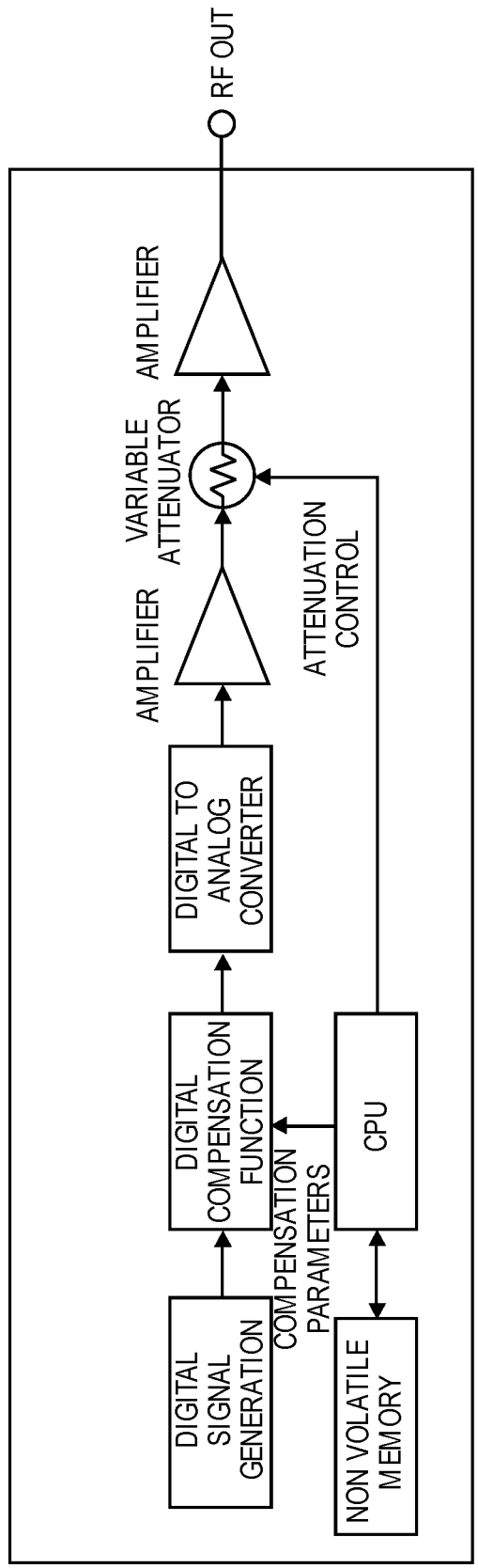
FIG. 1 is a block diagram of digital compensation functions according to the prior art.
Figure 2:
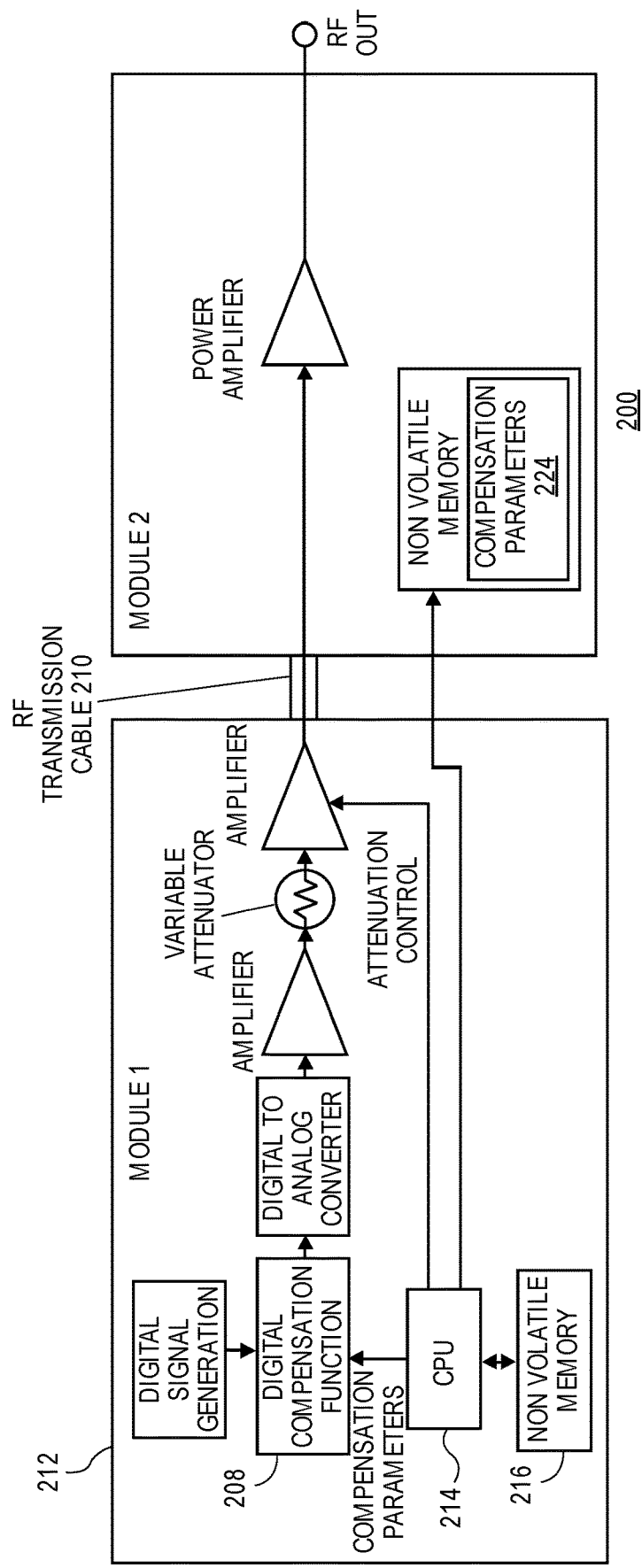
FIG. 2 is a block diagram of a system composed of multiple independent modules capable of digital compensation of RF imperfections according to an embodiment of the invention.

Embodiments of the invention overcome these challenges to enable the compensation for RF imperfections in a system comprising two or more independent modules. FIG. 2 is a block diagram of a system 200 composed of multiple independent modules capable of digital compensation of RF imperfections according to an embodiment of the invention. System 200 comprises two independent modules, denoted module 1 and module 2 in FIG. 2. System 200 may be employed within a remote PHY node. In one embodiment, module 1 may correspond to a remote PHY device (RPD) and module 2 may correspond to a RF amplifier module. Each module of system 200 may correspond to a variety of different modules comprised within a remote PHY device, including without limitation a remote PHY device, an Ethernet switch, a Remote MACPHY Device (RMD), a Passive Optical Network (PON) Optical Line Terminal (OLT), a Passive Optical Network (PON) Optical Network Unit (ONU), and a Wi-Fi hot spot router.

Module 1 and module 2 are coupled via a RF transmission cable 210. RF transmission cable 210, as broadly used herein, represents any medium for propagating a RF signal from one independent module to another independent module. As an example, RF transmission cable 210 may be implemented by a coaxial cable.

System 200 enables the compensation of RF variability and imperfections in both module 1 and module 2. An automated calibration system may be used during the manufacturing of module 1 to measure the RF signal imperfections at module 1 and create compensation parameters 212 for module 1 imperfections. Compensation parameters 212 are then stored in non-volatile memory 216 of module 1. A separate automated calibration system may be used during the manufacturing of module 2 to measure the RF signal imperfections at module 2 and create compensation parameters 224 for module 2 imperfections. Compensation parameters 224 are then stored in non-volatile memory 220 of module 2.

During operation of system 200, an algorithm is used to combine the compensation parameters 212 stored in module 1 with compensation parameters 224 stored in module 2. The combination of compensation parameters 212 and 224 are then applied to the Digital Compensation Function 208 implemented in Module 1. Thereafter, Digital Compensation Function 208 digitally compensates for the RF circuit imperfections and various variabilities present in both module 1 and module 2. CPU 214 of module 1 may obtain compensation parameters 224 stored in non-volatile memory 220 of module 2 via RF transmission cable or indirectly through intermediators.

Advantageously, in an embodiment, Digital Compensation Function 208 digitally compensate for the RF circuit imperfections and various variabilities present in both module 1 and module 2, without module 2 comprising any RF compensation elements therein. Such an embodiment beneficially reduces the cost of module 2, as module 2 need not comprise any RF compensation elements therein to enjoy the benefits of having Digital Compensation Function 208 digitally compensate for the RF circuit imperfections and various variabilities present in both module 1 and module 2.

Figure 3:
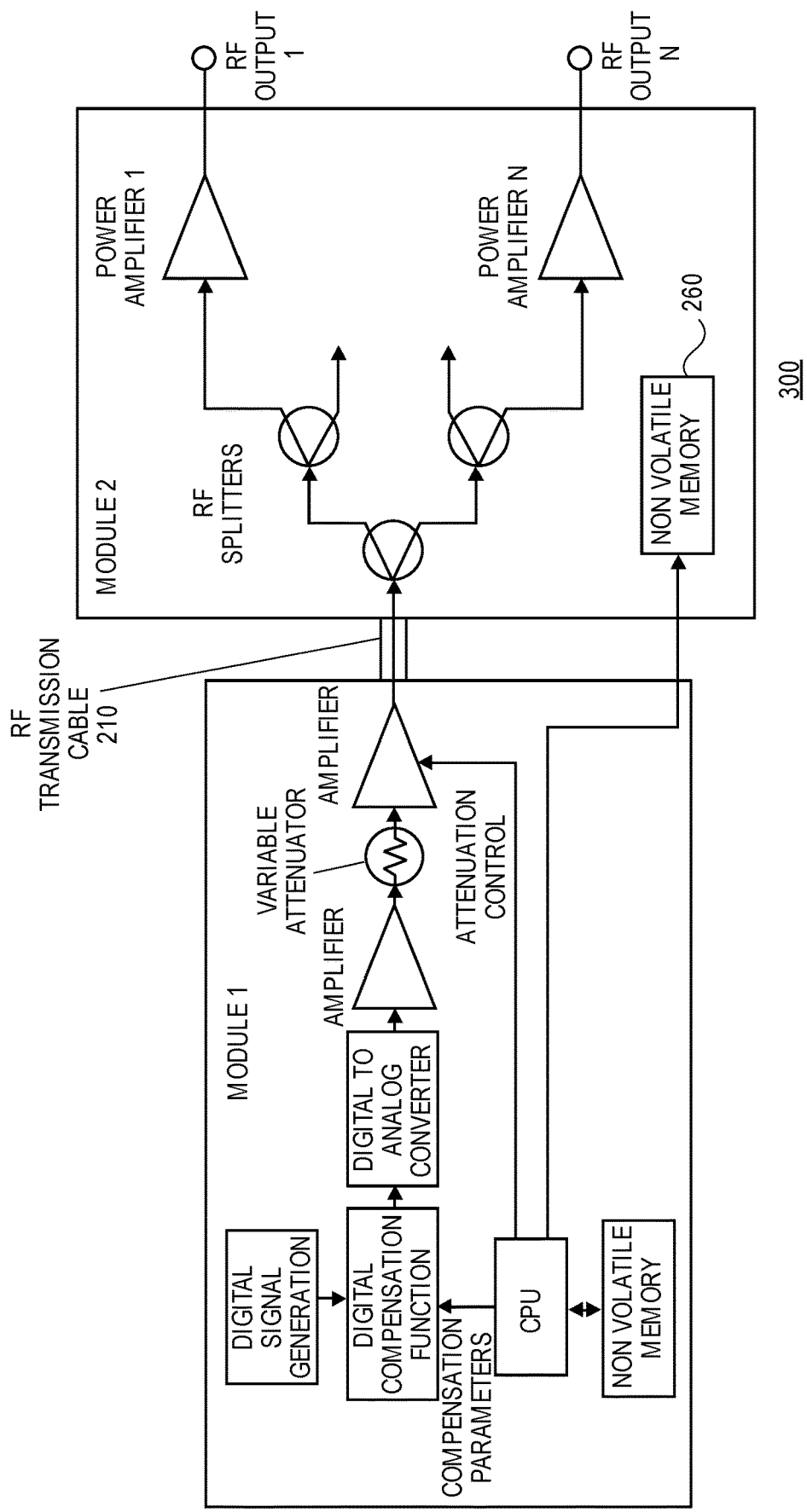
FIG. 3 is a block diagram of a system composed of multiple independent modules, at least one of which having multiple RF output ports, capable of digital compensation of RF imperfections according to an embodiment of the invention.

In another embodiment of the invention, module 2 includes a plurality of RF chains, leading to a plurality of RF outputs. To illustrate such an embodiment, consider FIG. 3, which is a block diagram of a system 300 of multiple independent modules according to an embodiment of the invention, where module 2 comprises a plurality of RF outputs. As shown in FIG. 3, module 2 comprises RF output labeled 1 and N, which represents that module 2 may comprise any number of RF output ports, while only 2 are depicted in the simplified illustration of FIG. 3.

A single digital compensation function cannot concurrently compensate for each one of the RF chains of module 2 shown in FIG. 3 such that each one of the RF outputs is separately optimized. However, the calibration scheme of module 2 can be enhanced by employing a measurement device which measures and quantifies the RF signal imperfections at all outputs of module 2. These measurements can be further processed by the calibration system to produce a single set of compensation parameters using schemes such as averaging the different RF chain parameters, targeting least mean square errors, and the like. The calibration system then stores this single set of parameters in non-volatile memory 260 incorporated in module 2. Thereafter, module 1 may operate as descried above in reference to FIG. 2 wherein module 2 has a single RF output.

Figure 4:
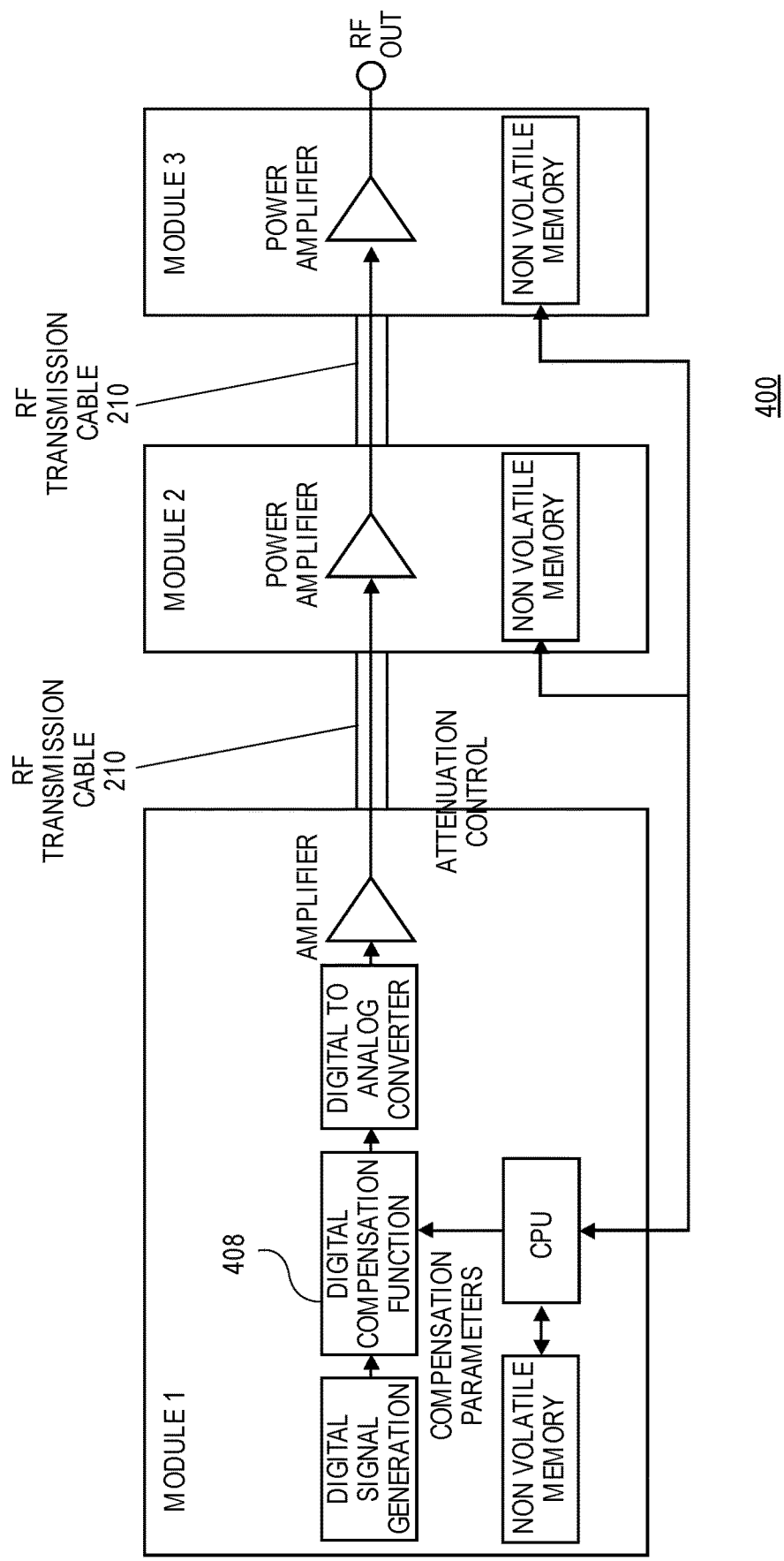
FIG. 4 is a block diagram of a system composed of three independent modules capable of digital compensation of RF imperfections according to an embodiment of the invention.

In yet another embodiment, the system may be composed of a cascade of RF modules, whereby the first module includes digital generation of the RF signal and a digital compensation function, and all other RF chains, each with its own RF imperfections and variability. Such an embodiment is depicted by FIG. 4, which is a block diagram of a system 400 composed of three independent modules capable of digital compensation of RF imperfections according to an embodiment of the of which may be calibrated separately by its own automated calibration system. Each automated calibration system will store compensation parameters in the module it calibrated. Thereafter, during operation of system 400, an algorithm is used to combine the compensation parameters stored in cascaded modules 1, 2, and 3 provide the combined compensation parameters to Digital Compensation Function 408 implemented in module 1. Thereafter, Digital Compensation Function 408 implemented in module 1 may digitally compensate for the RF circuit imperfections and various variabilities present in all modules, namely modules 1, 2, and 3. Obtainment of the non-volatile compensation parameters from the cascaded modules (modules 2 and 3) can be done by via RF transmission cable 210 either directly or indirectly (through intermediators).

Embodiments may be used to enable a remote PHY device (RPD) to compensate for imperfections and variabilities of the RF launch amplifier co-sharing a remote PHY node. Each of the modules (the RPD and the RF launch amplifier) are factory calibrated independently; however, the abovementioned scheme enables the RPD to produce a pristine RF signal at the output of the RF launch amplifier without requiring RF compensation elements in the RF launch amplifier. Thus, the RF launch amplifier is simplified, its manufacturing cost is reduced, and its performance enhanced, all at the same time. A replacement of either one of the modules (RPD and RF launch amplifier) will not detract from the efficiency of the imperfection and variability compensation scheme.

In the foregoing specification, embodiments of the invention have been described with reference to numerous specific details that may vary from implementation to implementation. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. A process for compensating for radio frequency (RF) imperfections in a system comprising two or more independent modules, comprising:
    storing RF calibration data in one or more non-volatile mediums for two or more independent modules, wherein each of said two or more independent modules are electronically coupled in a sequence via a transmission medium; and
    at a first independent module of said two or more independent modules, digital compensating a RF signal for a set of modules in said two or more independent modules, wherein said set comprises said first independent module and at least one other module in said two or more independent modules.

2. The process of claim 1, wherein the set comprises all of the two or more independent modules.

3. The process of claim 1, wherein digital compensating the RF signal at the first independent module comprises retrieving a set of RF calibration data for said at least one other module over said transmission medium from a non-volatile medium residing at each of said at least one other module.

4. The process of claim 1, wherein said first independent module is a remote PHY device (RPD).

5. The process of claim 1, wherein each of said two or more independent modules is enclosed within a remote PHY node (RPN).

6. The process of claim 1, wherein each of said two or more independent modules is enclosed within a remote PHY node (RPN), and wherein one module in said two or more independent modules is a RF amplifier module, and wherein said RF amplifier module does not comprise any RF compensation elements therein.

7. The process of claim 1, wherein said at least one other module comprises a two or more RF outputs, and wherein digital compensating the RF signal for the set of modules in said two or more independent modules further comprises optimizing the RF for a particular RF output of said two or more RF outputs of said at least one other module.

8. The process of claim 1, wherein said two or more independent modules comprises at least three independent modules.

9. The process of claim 1, wherein said transmission medium is a coaxial cable.

10. A system comprising two or more independent modules, comprising:
    one or more processors; and
    one or more non-transitory storage mediums storing one or more sequences of instructions, which when executed by the one or more processors, cause:
        storing radio frequency (RF) calibration data in said one or more non-transitory storage mediums for said two or more independent modules, wherein each of said two or more independent modules are electronically coupled in a sequence via a transmission medium; and
        at a first independent module of said two or more independent modules, digital compensating a RF signal for a set of modules in said two or more independent modules, wherein said set comprises said first independent module and at least one other module in said two or more independent modules.

11. The system of claim 10, wherein the set comprises all of the two or more independent modules.

12. The system of claim 10, wherein digital compensating the RF signal at the first independent module comprises retrieving a set of RF calibration data for said at least one other module over said transmission medium from a non-volatile medium residing at each of said at least one other module.

13. The system of claim 10, wherein said first independent module is a remote PHY device (RPD).

14. The system of claim 10, wherein each of said two or more independent modules is enclosed within a remote PHY node (RPN).

15. The system of claim 10, wherein each of said two or more independent modules is enclosed within a remote PHY node (RPN), and wherein one module in said two or more independent modules is a RF amplifier module, and wherein said RF amplifier module does not comprise any RF compensation elements therein.

16. The system of claim 10, wherein said at least one other module comprises a two or more RF outputs, and wherein digital compensating the RF signal for the set of modules in said two or more independent modules further comprises optimizing the RF for a particular RF output of said two or more RF outputs of said at least one other module.

17. The system of claim 10, wherein said two or more independent modules comprises at least three independent modules.

18. The system of claim 10, wherein said transmission medium is a coaxial cable.

19. One or more non-transitory storage mediums storing one or more sequences of instructions, which when executed, cause:

- storing radio frequency (RF) calibration data in one or more non-volatile storage mediums for two or more independent modules, wherein each of said two or more independent modules are electronically coupled in a sequence via a transmission medium; and
- at a first independent module of said two or more independent modules, digital compensating a RF signal for a set of modules in said two or more independent modules, wherein said set comprises said first independent module and at least one other module in said two or more independent modules.

20. The one or more non-transitory storage mediums of claim 19, wherein each of said two or more independent modules is enclosed within a remote PHY node (RPN), and wherein one module in said two or more independent modules is a RF amplifier module, and wherein said RF amplifier module does not comprise any RF compensation elements therein.

* * * * *